United States Patent [19]

Allison

[11] 4,322,806

[45] Mar. 30, 1982

[54] FREQUENCY RESPONSE ANALYZER

[76] Inventor: Henrick Allison, 11 Ulster Rd., Floreat Park, Western Australia, Australia, 6014

[21] Appl. No.: 76,353

[22] Filed: Sep. 17, 1979

[30] Foreign Application Priority Data

Sep. 18, 1978 [AU] Australia .............................. PD5995

[51] Int. Cl.³ ............................................. G01R 23/00
[52] U.S. Cl. .................................. 364/485; 324/77 B; 364/579
[58] Field of Search ............... 364/485, 579, 580, 574, 364/575; 324/77 R, 77 B

[56] References Cited

U.S. PATENT DOCUMENTS

| | | | |
|---|---|---|---|
| 3,328,686 | 6/1967 | Fuchs | 364/485 |
| 3,416,081 | 12/1968 | Gutleber | 364/485 |
| 3,634,760 | 1/1972 | Murtin et al. | 364/485 |
| 3,821,482 | 6/1974 | Hirsch | 324/77 B |
| 3,988,667 | 10/1976 | Roth et al. | 364/485 |
| 4,157,457 | 6/1979 | Sakoe et al. | 364/485 |

FOREIGN PATENT DOCUMENTS

382111  8/1973  U.S.S.R. .............................. 364/485

*Primary Examiner*—Errol A. Krass
*Attorney, Agent, or Firm*—Harness, Dickey & Pierce

[57] ABSTRACT

A frequency response analyzer having means for producing a phase modulated test signal for input into the system under test; means for dividing the output signal from the system under test into two channels. Means for multiplying the test signal of each channel by a reference signal; the reference signal of one channel corresponding to the test signal and the other reference signal corresponding to the test signal but being out of phase thereto by 90°; means for integrating the product of each channel, and means for analyzing the resultant signal from each channel.

5 Claims, 3 Drawing Figures

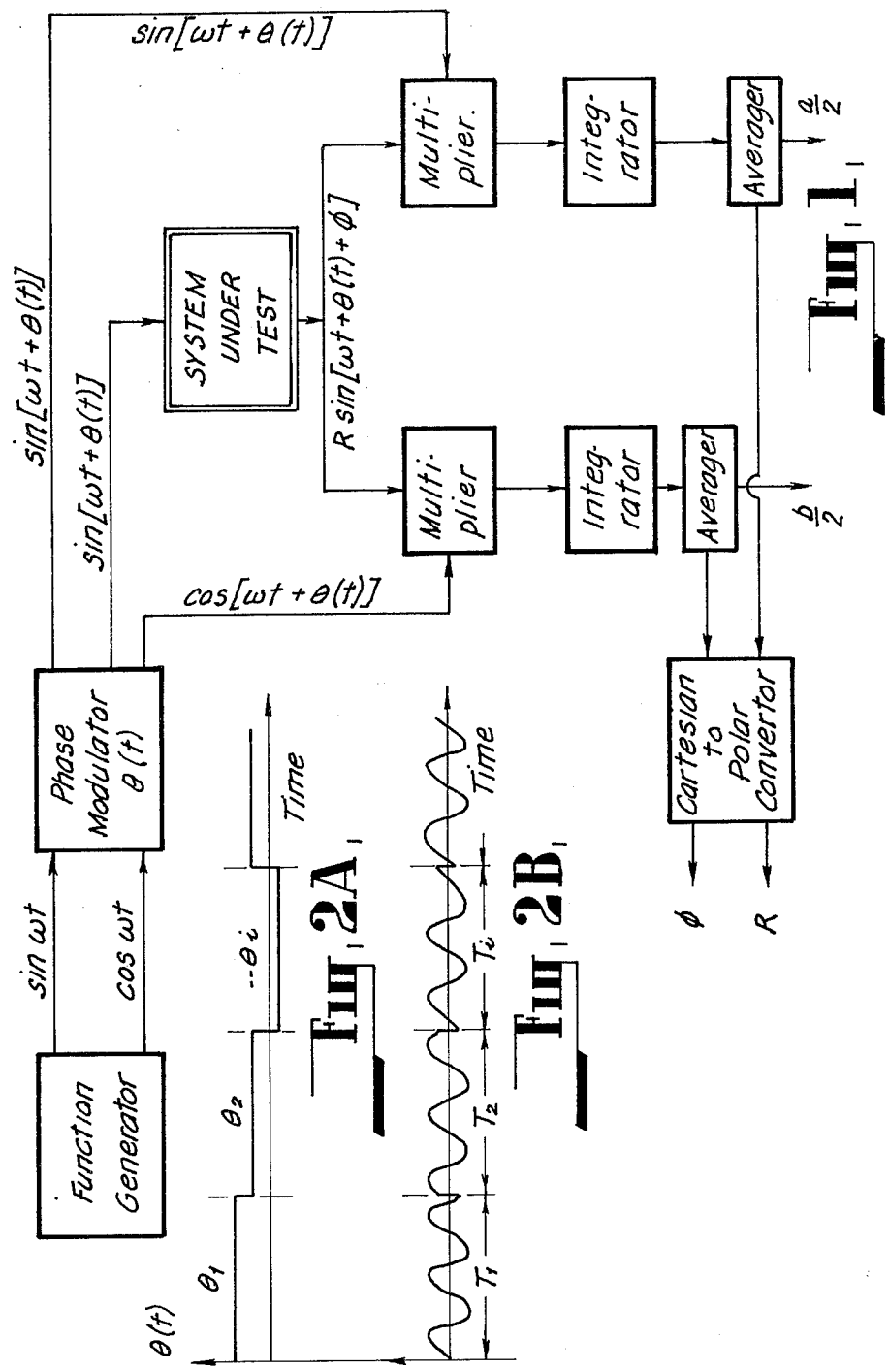

FREQUENCY RESPONSE ANALYZER

This invention relates to a frequency response analyzer for testing the frequency characteristics of mechanical or other systems.

Such testing is currently performed by exciting the system under test using a test signal and then operating on the output signal using a reference signal which corresponds to the test signal. The operation performed between the output and reference signal comprises a multiplication of the signals and an integration of the product.

The known Frequency Response Analyzers, include a function generator, multipliers, integrators combined to form a correlator, which multiplies the output signal from the system under test by sine and cosine reference signals which are shifted by ninety degrees (90°) from each other and derived directly from the function generator and integrates the products to obtain the values, proportional to "In-Phase" and "Quadrature" Components of the waveform to be analyzed, which then are converted to a polar form by a converter. Action of the known frequency response analyzer can be summarised as follows:

$$\frac{a}{2} = \frac{1}{NT} \int_0^{NT} R \sin(\omega t + \phi) \sin\omega t \, dt = \frac{1}{2} R \cos\phi;$$

$$\frac{b}{2} = \frac{1}{NT} \int_0^{NT} R \sin(\omega t + \phi) \cos\omega t \, dt = \frac{1}{2} R \sin\phi;$$

Cartesian-to-polar converter calculates the final values:

$$R = \sqrt{a^2 + b^2} \; ; \; \phi = \tan^{-1}\left(\frac{b}{a}\right) ;$$

Where: NT is the integration time of N cycles of the analyzed waveform of period T.

For example, the commercial types of Transfer Function Analysers such as "TFA JM 1600 Solarthron Schlumberger," or "1170 Frequency Response Analyser" of the same company are based on this method.

Due to orthogonality of sine and cosine functions, this type of frequency response analyzer efficiently rejects harmonics of the test signal, any periodical interfering signals with the frequency different from that of reference signal and rejects as well noise components, which can be present in the waveform to be analyzed.

For example
(a) For interfering harmonics of the order n:

$$\frac{1}{NT} \int_0^{NT} \sin(n\omega t + n\phi) \sin\omega t \, dt = 0$$

for $N = 2, 3, 4 \ldots$ (b) For interfering periodical signals with the frequency $\omega_i$ different from analysed frequency $\omega$:

$$\frac{1}{NT} \int_0^{NT} \sin\omega_i t \cdot \sin\omega t \, dt \longrightarrow 0$$

$$NT \longrightarrow \infty$$

providing $\omega_i \neq \omega$.

(c) For interfering random processes n(t) of the "white noise" type with the uncorrelated values $$\frac{1}{NT} \int_0^{NT} n(t) \sin\omega t \, dt \longrightarrow 0$$

$$NT \longrightarrow \infty$$

But the known frequency response analyzer has certain failures. If interfering superimposed signals have the same frequency as that one analyzed, this signal will not be rejected.

For example, if the interfering signal:

$$s(t) = \epsilon \sin(\omega t + \psi),$$

$$\frac{1}{NT} \int_0^{NT} \epsilon \sin(\omega t + \psi) \sin\omega t \, dt = \frac{1}{2} \epsilon \cos\psi \neq 0$$

(The same for the second component.)

This occurs, for example, when the analyzed system is machinery with shafts, rotating with given frequency. In addition harmonics of this frequency are not rejected.

For example consider an interfering signal comprising harmonics $n\omega$ $$\frac{1}{NT} \int_0^{NT} \epsilon \sin(n\omega t + n\psi) \sin n\omega t \, dt = \frac{1}{2} \epsilon \cos n\psi \neq 0$$

(The same for the second component.)

Another such case occurs when the sharp-resonant system is affected by interfering "noise" with a wide spectrum. The system selects the vibrations with the frequencies, coincident with its resonant frequencies, and the system output is then a narrow bandwidth random signal which may be described as a "sine-wave with random amplitudes".

For example consider an interfering signal n(t) at the resonant frequencies $\omega_i$ of the system.

The response of the system with high quality to random noise may be represented as the sum of components.

$$s_i(t) = (s_i) \sin(\omega_i t + \psi_i)$$

Then at the output of one channel of Frequency Response Analyzer we have:

$$\frac{1}{NT} \int_0^{NT} (s_i) \sin(\omega_i t + \psi_i) \sin\omega_i t \, dt = \frac{1}{2} (s_i) \cos\psi_i \neq 0$$

(The same for the second component.)

Consequently, the known Frequency Response Analyzers give distorted results at the most interesting points of frequency response, i.e. at the resonant points, if the sharpresonant system is affected by noise.

The prolongation of integrating time does not improve the rejection of this type of interference.

It is an object of the present invention to provide a frequency response analyzer which is capable of rejecting foreign signals having a frequency corresponding to the output signal or harmonics thereof.

In one form the invention resides in a frequency response analyzer having means for producing a phase modulated test signal for input into the system under test; means for dividing the output signal from the system under test into two channels; means for multiplying the signal of each channel by a reference signal; the reference signal of one channel corresponding to the test signal and the other reference signal corresponding to the test signal but being out of phase thereto by 90°; means for integrating the product of each channel, and means for analyzing the resultant signal from each channel.

The invention will be more fully understood in the light of the following description of one specific embodiment. The description is made with reference to the accompanying drawings of which:

FIG. 1 is a block circuit of the embodiment; and

FIGS. 2A and 2B are representations of the forms of test signal which can be used with the embodiment.

The frequency response analyzer of the embodiment comprises a function generator and a phase modulator, a signal multiplier, an integrator and a cartesian to polar converter which provides the frequency characteristics of the output signal of the system under test. The test signal from the function generator is phase modulated at the phase modulator and the resultant signal is introduced into the system under test. The resultant output of the signal under test is distributed into two channels and each channel incorporates a multiplier to multiply the output signal with a phase modulated reference signal which originates from the function generator. One of the reference signals corresponds to the test signal while the other corresponds to the test signal but is 90° out of phase therewith.

The action of the frequency response analyzer can be explained as follows:

Consider the case of a very slow (compared with the frequency of the test signal) modulation function $\theta(t)$, which can be then approximated as a series of step-functions with the constant values $\theta_i$, over the time intervals $T_i$, to which the total integration time is subdivided (FIG. 2a). The phase-modulated testing signal can be described now as a train of sine waveforms with the same amplitudes but different phases $\theta_i$ at intervals $T_i$, according to modulation function $\theta(t)$, as shown in FIG. 2b. After transients in the system under test decay, the response to the phase modulated test signal will have the same phase modulation as the testing signal, and hence, being multipled by reference signals with exactly the same phase-modulation and integration over periods of time $T_i$ gives the "In-phase" and "Quadrature" values (see Formula 1 below). Hence, the Integrators outputs are independent of the modulation function over the total period of integration, i.e. the frequency response analyzer is invariant to the slow simultaneous phase modulation of both test signal and reference signals. That means, that in spite of the phase modulation, the proper values of "In-phase" and "Quadratize" components are obtained at the integrators outputs after total integration time completed. Being averaged by the Averager these outputs are not changed, as they are equal constants. As for interference signals, the situation is different as the proposed FRA is not invariant to the phase modulation of reference signals only. This fact enables the rejection of interference signals with the same frequency as that of the test signals. In spite of coincidences of frequencies of test signal and interference signal, there is the important difference between them; the test signal is artificially phase-modulated, while the interference signal is not, consequently the integrators output depends on the modulation function, thus giving opportunity to reject this interfering signal. Particularly, the result of the frequency response analyzers action over a period of time $T_i$ depends on the value $\theta_i$ (see Formula 2 below).

Averaging of the even number of these values over the collection of $\theta_i$ gives zero, providing the modulation function $\theta(t)$ is periodic, taking the values $\theta_i$ between 0 and $\pi$ or $\pm \pi/2$.

Consider, for example, the simplest case of the $\theta(t)$ as a square periodical function with 2 values only $\theta_1$ and $\theta_2$, when $\theta_2 = \theta_1 - \pi$ $$\frac{1}{2} \sum_{i=1}^{2} \frac{1}{2} \epsilon \cos(\psi - \theta_i) =$$

$$\frac{\epsilon}{4} (\cos(\psi - \theta_i) + \cos(\psi - \theta_i + \pi)) = 0$$

Hence, the average over any even number of $\theta_i$ gives zero.

Consequently, the proposed frequency response analyzer rejects the interference signal with the frequency equal to that of the test signal, as well as the harmonics of the interference signal and narrow-band random vibrations, within the frequency equal or close to the analysed one.

There are several modifications which can be made to the frequency response analyzer of the embodiment.

(a) The averager can be excluded, providing integration constants of the integrators are long enough to cover the total time range of the sum of subdivisions $T_i$, averaging over $\theta_i$ being then done by integrators themselves.

(b) As the modulation function is not prescribed, many particular cases of modulators can be used. In the simplest form it may be switches, changing the polarity of test and reference signals simultaneously, thus leading to a square modulation function and rejecting the interfering signals after odd number of switchings.

(c) Some types of modulation function can be more effective than others. For example, to reject a deterministic interference such as a sine wave, a square modulation function is quite suitable but to reject interference with arbitary amplitudes a random modulation function might be more effective.

FORMULA 1:

Over the interval $T_i$ the test signal has the certain phase-modulation shift $\theta_i$, which is a constant, hence the system response have the same phase-shift $\theta_i$ and can be written as $$R \sin(\omega t + \phi + \theta_i) \mid \text{for time } t \text{ inside the interval } T_i$$

The reference signals have the same phase shift $\theta_i$; hence:

$$\frac{1}{T_i} \int_{T_i} R \sin(\omega t + \phi + \theta_i) \sin(\omega t + \theta_i) \, dt = \frac{1}{2} R \cos \phi$$

-continued $$\frac{1}{T_i} \int_{T_i}^{R} \sin(\omega t + \phi + \theta_i) \cos(\omega t + \theta_i) \, dt = \tfrac{1}{2} R \sin \phi$$

Hence, integration over each time $T_i$ gives the same values (a/2) and (b/2), independently of phase modulation $\theta_i$.

FORMULA 2:

The interference signal $s(t) = \epsilon \sin(\omega t + \psi)$, being uncorrelated in phase with reference phase-modulated signals, gives the value dependent on $\theta_i$ for each time interval $T_i$:

$$\frac{1}{T_i} \int_{T_i} \epsilon \sin(\omega t + \psi) \sin(\omega t + \theta_i) \, dt = \tfrac{1}{2} \epsilon \cos(\psi - \theta_i)$$

$$\frac{1}{T_i} \int_{T_i} \epsilon \sin(\omega t + \psi) \cos(\omega t + \theta_i) \, dt = \tfrac{1}{2} \epsilon \sin(\psi - \theta_i)$$

The claims defining the invention are as follows:

1. A frequency response analyzer having a signal generator for producing a test signal for input into a system under test, a first reference signal and a second reference signal; said first reference signal being identical to said test signal and said second reference signal being identical to said reference signal but being 90 degrees out of phase therewith; a phase-modulator for simultaneously incorporating a phase shift function which is variable in time into said test signal and into said first and said second reference signals; a sensor for detecting an output signal from the system under test; a divider for dividing the output signal from the system under test sensed by said sensor into two channels; a multiplier in each of said channels, one of said multipliers multiplying the output signal by said first reference signal and the other of said multipliers multiplying the output signal by said second reference signal; an integrator in each channel for integrating the output of the respective of said multipliers; an averager in each channel for averaging the outputs of the respective integrator; and a cartesian to polar converter for conversion of the averaged signal of each channel to a polar form, and an output means for each channel.

2. A frequency response analyzer as claimed in claim 1 wherein a set of sequential outputs from the integrator in each channel are averaged by the averager over a period of time which comprises a multiple of the integration periods of each integrator.

3. A frequency response analyzer as claimed in claim 1 wherein the phase shift function comprises a regular periodic change in the polarity of the test signal, the first reference signal and second reference signal.

4. A frequency response analyzer as claimed in claim 1 wherein the test signal comprises the function sin (wt+$\theta$(t)) and the two reference signals are sin (Wt+$\theta$(t)) and cos (Wt+$\theta$(t)) wherein 0 comprises the phase shift function.

5. A frequency response analyzer as claimed at claim 1 wherein the modulation function is periodic and each integrator produces integrands of the corresponding output signal for each period of the modulation function and the integrands are averaged by the corresponding averager for a time interval of at least two of the periods.

* * * * *